US011302264B2

(12) United States Patent
Gao et al.

(10) Patent No.: US 11,302,264 B2
(45) Date of Patent: Apr. 12, 2022

(54) SYSTEMS AND METHODS FOR COMPENSATING FOR IR DROP ACROSS A DISPLAY

(71) Applicant: Apple Inc., Cupertino, CA (US)

(72) Inventors: Shengkui Gao, San Jose, CA (US); Marc Joseph DeVincentis, Palo Alto, CA (US); Yue Jack Chu, Cupertino, CA (US); Sinan Alousi, Campbell, CA (US); Mohammad Hajirostam, San Jose, CA (US); Mohammad Ali Jangda, San Jose, CA (US); Koorosh Aflatooni, Los Altos Hills, CA (US); Pierre-Yves Emelie, Mountain View, CA (US); Yafei Bi, Los Altos Hills, CA (US); Paolo Sacchetto, Cupertino, CA (US); Kasra Omid-Zohoor, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/510,755

(22) Filed: Jul. 12, 2019

(65) Prior Publication Data
US 2020/0143750 A1 May 7, 2020

Related U.S. Application Data

(60) Provisional application No. 62/755,103, filed on Nov. 2, 2018.

(51) Int. Cl.
*G09G 3/3291* (2016.01)
*G09G 3/3233* (2016.01)
*G09G 3/36* (2006.01)
*H01L 27/32* (2006.01)

(52) U.S. Cl.
CPC ......... *G09G 3/3291* (2013.01); *G09G 3/3233* (2013.01); *H01L 27/326* (2013.01); *H01L 27/3246* (2013.01); *G09G 3/3648* (2013.01)

(58) Field of Classification Search
CPC .. G09G 3/3291; G09G 3/3233; G09G 3/3648; H01L 27/3246; H01L 27/326
See application file for complete search history.

(56) References Cited

U.S. PATENT DOCUMENTS

| 6,727,874 | B2 * | 4/2004 | Okuzono | ............ G09G 3/2011 345/690 |
| 8,471,788 | B2 | 6/2013 | Cha et al. | |
| 8,914,246 | B2 | 12/2014 | Chaji et al. | |

(Continued)

*Primary Examiner* — Chanh D Nguyen
*Assistant Examiner* — Ngan T. Pham-Lu
(74) *Attorney, Agent, or Firm* — Fletcher Yoder, P.C.

(57) ABSTRACT

A display device may include rows of pixels that display image data on a display and a circuit. The circuit may receive pixel data value of image data for a pixel in a first row of the rows of pixels, determine a weight factor to apply to the pixel data value based on a position of the first row with respect to the other rows, such that each row is associated with a current-resistance (IR) drop across the display. The weight factor is determined based on a respective IR drop associated with the first row. The circuit may also generate a weighted pixel data value based on the weight factor and the pixel data value and send the weighted pixel data value to a display driver circuit that renders the image data via the display.

18 Claims, 11 Drawing Sheets

(56) References Cited

U.S. PATENT DOCUMENTS

| | | | |
|---|---|---|---|
| 8,994,617 B2 | 3/2015 | Chaji et al. | |
| 10,217,402 B1 | 2/2019 | Vahid Far et al. | |
| 2003/0058211 A1* | 3/2003 | Kim | G09G 3/3629 |
| | | | 345/89 |
| 2007/0176862 A1 | 8/2007 | Kurt et al. | |
| 2010/0194769 A1* | 8/2010 | Mori | G09G 3/22 |
| | | | 345/589 |
| 2010/0315319 A1* | 12/2010 | Cok | G09G 3/20 |
| | | | 345/77 |
| 2011/0227955 A1* | 9/2011 | Lee | G09G 3/3648 |
| | | | 345/690 |
| 2014/0176625 A1* | 6/2014 | Yoon | G09G 3/3233 |
| | | | 345/691 |
| 2016/0163258 A1* | 6/2016 | Cho | G09G 3/3225 |
| | | | 345/690 |
| 2016/0247445 A1* | 8/2016 | Zhang | G09G 3/2003 |
| 2016/0307511 A1* | 10/2016 | Fujii | G09G 3/20 |
| 2018/0190196 A1* | 7/2018 | Kwon | G09G 3/3241 |
| 2019/0164484 A1* | 5/2019 | Yeo | G09G 3/3233 |
| 2020/0051508 A1* | 2/2020 | Tan | G09G 3/3225 |
| 2020/0082761 A1* | 3/2020 | Kim | H01L 27/3276 |

* cited by examiner

SYSTEMS AND METHODS FOR COMPENSATING FOR IR DROP ACROSS A DISPLAY

CROSS REFERENCE TO RELATED APPLICATION

This application claims priority to U.S. Provisional Patent Application No. 62/755,103, filed Nov. 2, 2018, and entitled "SYSTEMS AND METHODS FOR COMPENSATING FOR IR DROP ACROSS A DISPLAY," the disclosure of which is incorporated herein by reference in its entirety and for all purposes

BACKGROUND

The present disclosure relates to systems and methods for sensing characteristics of pixels in electronic display devices to compensate for non-uniformity in luminance or color of a pixel with respect to other pixels in the electronic display device.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

As electronic displays are employed in a variety of electronic devices, such as mobile phones, televisions, tablet computing devices, and the like, manufacturers of the electronic displays continuously seek ways to improve the consistency of colors depicted on the electronic display devices. For example, given variations in manufacturing, various noise sources present within a display device, or various ambient conditions in which each display device operates, different pixels within a display device might emit a different color value or gray level even when provided with the same electrical input. It is desirable, however, for the pixels to uniformly depict the same color or gray level when the pixels are programmed to do so to avoid visual display artifacts due to inconsistent color.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In certain electronic display devices, light-emitting diodes such as organic light-emitting diodes (OLEDs), micro-LEDs (µLEDs), or active matrix organic light-emitting diodes (AMOLEDs) may be employed as pixels to depict a range of gray levels for display. However, due to various properties associated with the operation of these pixels within the display device, a particular gray level output by one pixel in a display device may be different from a gray level output by another pixel in the same display device upon receiving the same electrical input. In some cases, the distribution of power or voltage across a power or voltage rail in a display may vary across the display. That is, as the border or bezel region of electronic display becomes smaller, the size of the power rail disposed in the electronic displays becomes smaller. As a result of using smaller more compact power rails, a current-resistance (IR) drop may be experienced by the pixel circuits powered by the power rails, thereby affecting the accuracy of the color and luminance depicted by the corresponding pixel.

With the foregoing in mind, the presently disclosed embodiments include employing a weighted average pixel level (APL) system that models the expected IR drop across an electronic display. Based on the expected IR drop at various pixels across the electronic display, a voltage adjustment system may adjust the pixel value or gray level value (e.g., digital value) of a respective pixel to compensate for the expected decrease in voltage at the pixel circuit due to the expected IR drop. In another embodiment, the voltage adjustment system may adjust or modify a gamma voltage (e.g., analog voltage) employed by pixel circuits to generate pixel voltages. In either case, the voltage adjustment system may enable the electronic display to present color values and luminance values in pixels across the electronic display in a consistent manner despite the IR drop along the power rail.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which.

DETAILED DESCRIPTION

Figure 1:
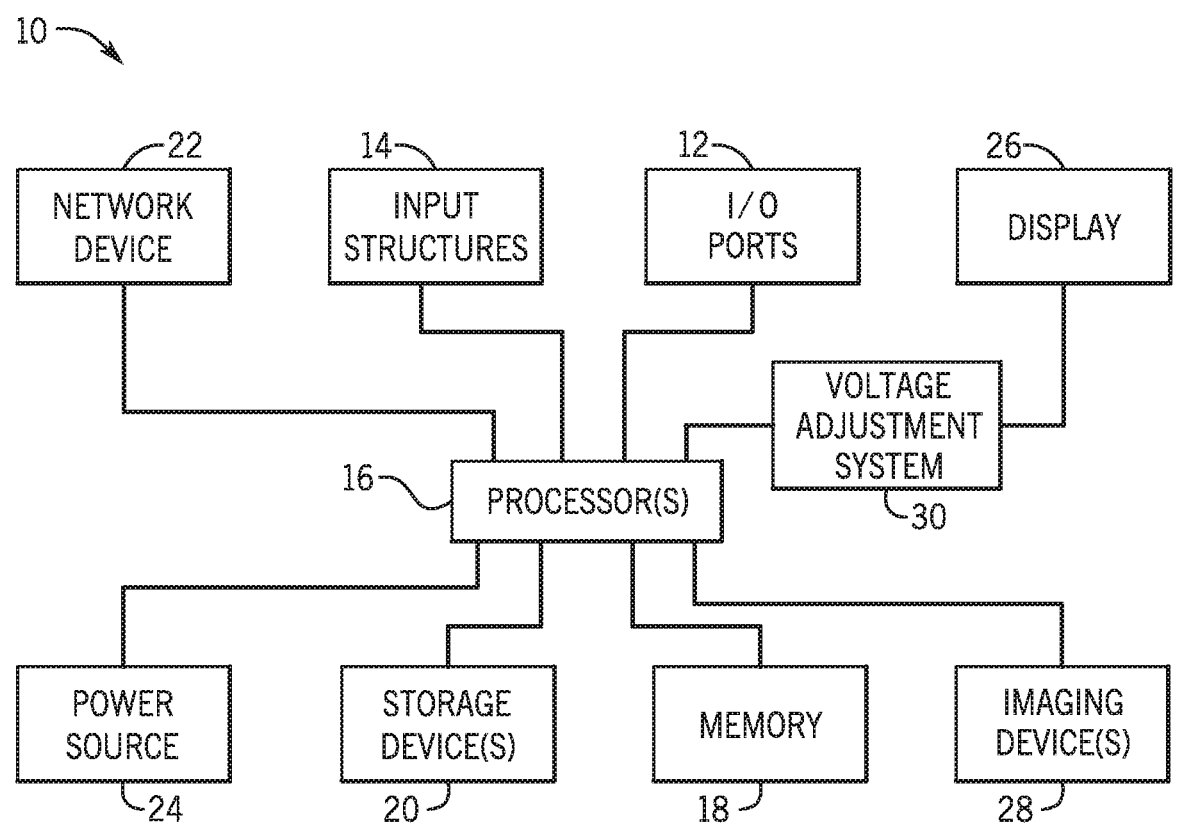
FIG. 1 is a simplified block diagram of components of an electronic device that may depict image data on a display, in accordance with embodiments described herein.

One or more specific embodiments of the present disclosure will be described below. These described embodiments are only examples of the presently disclosed techniques. Additionally, in an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but may nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

Organic light-emitting diode (e.g., OLED, AMOLED) display panels provide opportunities to make thin, flexible, high-contrast, and color-rich electronic displays. Generally, OLED display devices are current driven devices and use thin film transistors (TFTs) as current sources to provide certain amount of current to generate a certain level of luminance to a respective pixel electrode. As discussed above, a power or voltage rail may provide a voltage to each pixel driving circuit in a display. However, due to current-resistance (IR) drop across a display panel over the length of the power or voltage rail, the current provided to one pixel located closer to the power supply as compared to another pixel located farther away from the power supply may exhibit different color and luminance properties when programmed to depict the same image data. In addition, image data to be depicted by pixels of a display may present different color or luminance values depending on the load of the entire display during a frame of image data. That is, if a portion of the display is to depict a first image while the remaining portion of the display depicts a white color, the pixel circuitry for each pixel of portion of the display may not provide the same current to each respective pixel, as compared to when the portion of the display is to depict the same first image while the remaining portion of the display depicts a black color. That is, the different frame loading of the image data may cause the IR drop across the display to change and thus result in inconsistent color and luminance values for the same first image due to the change in the load of the frame of image data.

In addition, if a portion of the display is to depict a first image while the remaining portion of the display depicts a second image, the pixel circuitry for each pixel of a portion of the display may not provide the same current to each respective pixel, as compared to the portion of the display that is to depict the same first image while the remaining portion of the display depicts the second image in a different orientation (e.g., landscape versus portrait). That is, even though the pixels of the display are driven according to the same current values, because the location of the content of the second image is displayed using different pixels, the different location of the image data may also cause the IR drop across the display to change and thus result in inconsistent color and luminance values for the same first image due to the change in locations of the pixels that depict the remaining content.

To help ensure that the display presents color and luminance values across the display in a consistent manner without regard to the load of the frame or the location of the content depicted in a frame of image data, the present disclosure includes a voltage adjustment system that compensates a digital pixel value provided to a pixel circuit or an analog voltage level that provides the voltage to be used by the pixel circuit based on an expected IR drop across the panel. In some embodiments, the expected IR drop across the panel may be estimated based on an expected resistance between each row of pixels, a total number of rows of pixels in the display, a common routing resistance with respect to the rows of pixels in the display, and an equivalent current from a particular row of pixels in the display.

Based on the expected IR drop across the rows of pixels in a display, a weight value may be determined for each row of the display. The weight value may correspond to value that corrects a pixel data value in light of the expected IR drop at the respective row. In some embodiments, a voltage adjustment system may apply a weight value to the pixel data value based on the particular row in which the respective pixel resides. As a result, the pixel data value provided to the pixel may compensate for the expected IR drop across the display.

In other embodiments, the voltage adjustment system may determine a weight value for a pixel in the display based on a gray level value for a pixel in the display, a display brightness value (DBV) for the display, and an average pixel level for the row of pixels in the display. The APL may indicate a percentage of the display that is illuminated (e.g., as compared to a full white display). Generally, the expected current provided to the rows of the display is proportional to the APL for the row of pixels. With this in mind, a lookup table of compensation or gain values may be generated based on the gray level of a pixel, the DBV for the display, and the APL for the pixel, such that the respective gain level may compensate a pixel data voltage for the expected IR drop in the display with respect to the location of the pixel and the frame load of the image data. In this way, the voltage adjustment system may provide a real-time compensation solution to compensate for the IR drop of the display as the image data changes for each frame. Additional details with regard to the systems and techniques involved with enabling the voltage adjustment system to compensate pixel data voltages or gamma voltages are detailed below with reference to FIGS. 1-12.

By way of introduction, FIG. 1 is a block diagram illustrating an example of an electronic device 10 that may include the sensing system mentioned above. The electronic device 10 may be any suitable electronic device, such as a laptop or desktop computer, a mobile phone, a digital media player, television, or the like. By way of example, the electronic device 10 may be a portable electronic device, such as a model of an iPod® or iPhone®, available from Apple Inc. of Cupertino, Calif. The electronic device 10 may be a desktop or notebook computer, such as a model of a MacBook®, MacBook® Pro, MacBook Air®, iMac®, Mac® Mini, or Mac Pro®, available from Apple Inc. In other embodiments, electronic device 10 may be a model of an electronic device from another manufacturer.

As shown in FIG. 1, the electronic device 10 may include various components. The functional blocks shown in FIG. 1 may represent hardware elements (including circuitry), software elements (including code stored on a computer-readable medium) or a combination of both hardware and software elements. In the example of FIG. 1, the electronic device 10 includes input/output (I/O) ports 12, input structures 14, one or more processors 16, a memory 18, non-volatile storage 20, networking device 22, power source 24, display 26, and one or more imaging devices 28. It should be appreciated, however, that the components illustrated in FIG. 1 are provided only as an example. Other embodiments of the electronic device 10 may include more or fewer components. To provide one example, some embodiments of the electronic device 10 may not include the imaging device(s) 28.

Before continuing further, it should be noted that the system block diagram of the device 10 shown in FIG. 1 is intended to be a high-level control diagram depicting various components that may be included in such a device 10. That is, the connection lines between each individual component shown in FIG. 1 may not necessarily represent paths or directions through which data flows or is transmitted between various components of the device 10. Indeed, as discussed below, the depicted processor(s) 16 may, in some embodiments, include multiple processors, such as a main processor (e.g., CPU), and dedicated image and/or video processors. In such embodiments, the processing of image data may be primarily handled by these dedicated processors, thus effectively offloading such tasks from a main processor (CPU).

Considering each of the components of FIG. 1, the I/O ports 12 may represent ports to connect to a variety of devices, such as a power source, an audio output device, or other electronic devices. The input structures 14 may enable user input to the electronic device, and may include hardware keys, a touch-sensitive element of the display 26, and/or a microphone.

The processor(s) 16 may control the general operation of the device 10. For instance, the processor(s) 16 may execute an operating system, programs, user and application interfaces, and other functions of the electronic device 10. The processor(s) 16 may include one or more microprocessors and/or application-specific microprocessors (ASICs), or a combination of such processing components. For example, the processor(s) 16 may include one or more instruction set (e.g., RISC) processors, as well as graphics processors (GPU), video processors, audio processors and/or related chip sets. As may be appreciated, the processor(s) 16 may be coupled to one or more data buses for transferring data and instructions between various components of the device 10. In certain embodiments, the processor(s) 16 may provide the processing capability to execute an imaging applications on the electronic device 10, such as Photo Booth®, Aperture®, iPhoto®, Preview®, iMovie®, or Final Cut Pro® available from Apple Inc., or the "Camera" and/or "Photo" applications provided by Apple Inc. and available on some models of the iPhone®, iPod®, and iPad®.

A computer-readable medium, such as the memory 18 or the nonvolatile storage 20, may store the instructions or data to be processed by the processor(s) 16. The memory 18 may include any suitable memory device, such as random access memory (RAM) or read only memory (ROM). The nonvolatile storage 20 may include flash memory, a hard drive, or any other optical, magnetic, and/or solid-state storage media. The memory 18 and/or the nonvolatile storage 20 may store firmware, data files, image data, software programs and applications, and so forth.

The network device 22 may be a network controller or a network interface card (NIC), and may enable network communication over a local area network (LAN) (e.g., Wi-Fi), a personal area network (e.g., Bluetooth), and/or a wide area network (WAN) (e.g., a 3G or 4G data network). The power source 24 of the device 10 may include a Li-ion battery and/or a power supply unit (PSU) to draw power from an electrical outlet or an alternating-current (AC) power supply.

The display 26 may display various images generated by device 10, such as a GUI for an operating system or image data (including still images and video data). The display 26 may be any suitable type of display, such as a liquid crystal display (LCD), plasma display, or an organic light emitting diode (OLED) display, for example. In one embodiment, the display 26 may include self-emissive pixels such as organic light emitting diodes (OLEDs) or micro-light-emitting-diodes (μ-LEDs).

Additionally, as mentioned above, the display 26 may include a touch-sensitive element that may represent an input structure 14 of the electronic device 10. The imaging device(s) 28 of the electronic device 10 may represent a digital camera that may acquire both still images and video. Each imaging device 28 may include a lens and an image sensor capture and convert light into electrical signals.

In certain embodiments, the electronic device 10 may include a voltage adjustment system 30, which may adjust a pixel data value provided to a pixel of the display 26 or adjust a gamma voltage used by pixel circuitry of the display 26. For instance, the voltage adjustment system 30 may use a voltage signal that is to be provided to a pixel of the display 26 to determine a compensation or gain value to apply to the voltage signal provided to the pixel based on the location of the pixel in the display 26. Generally, when the same voltage signal is provided to each pixel of the display 26, each pixel should depict the same gray level. However, due to current-resistance (IR) drop across the rows and columns of the display 26, the same voltage being applied to a number of pixels may result in a variety of different gray levels depicted across the number of pixels. As such, the voltage adjustment system 30 may modify the pixel data value or the gamma voltage provided to the pixels in accordance with the embodiments described herein to compensate for the expected IR drop.

Figure 2:
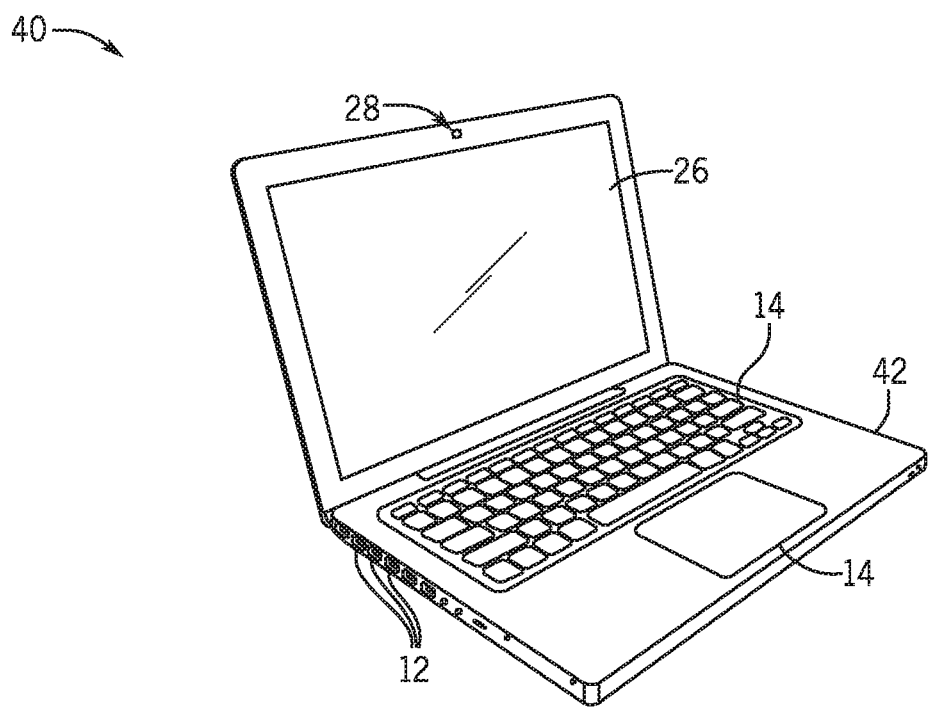
FIG. 2 is a perspective view of the electronic device of FIG. 1 in the form of a notebook computing device, in accordance with embodiments described herein.

As mentioned above, the electronic device 10 may take any number of suitable forms. Some examples of these possible forms appear in FIGS. 2-5. Turning to FIG. 2, a notebook computer 40 may include a housing 42, the display 26, the I/O ports 12, and the input structures 14. The input structures 14 may include a keyboard and a touchpad mouse that are integrated with the housing 42. Additionally, the input structure 14 may include various other buttons and/or switches which may be used to interact with the computer 40, such as to power on or start the computer, to operate a GUI or an application running on the computer 40, as well as adjust various other aspects relating to operation of the computer 40 (e.g., sound volume, display brightness, etc.). The computer 40 may also include various I/O ports 12 that provide for connectivity to additional devices, as discussed above, such as a FireWire® or USB port, a high definition multimedia interface (HDMI) port, or any other type of port that is suitable for connecting to an external device. Additionally, the computer 40 may include network connectivity (e.g., network device 22), memory (e.g., memory 18), and storage capabilities (e.g., storage device 20), as described above with respect to FIG. 1.

The notebook computer 40 may include an integrated imaging device 28 (e.g., a camera). In other embodiments, the notebook computer 40 may use an external camera (e.g., an external USB camera or a "webcam") connected to one or more of the I/O ports 12 instead of or in addition to the integrated imaging device 28. In certain embodiments, the depicted notebook computer 40 may be a model of a MacBook®, MacBook® Pro, MacBook Air®, or Power-Book® available from Apple Inc. In other embodiments, the computer 40 may be portable tablet computing device, such as a model of an iPad® from Apple Inc.

Figure 3:
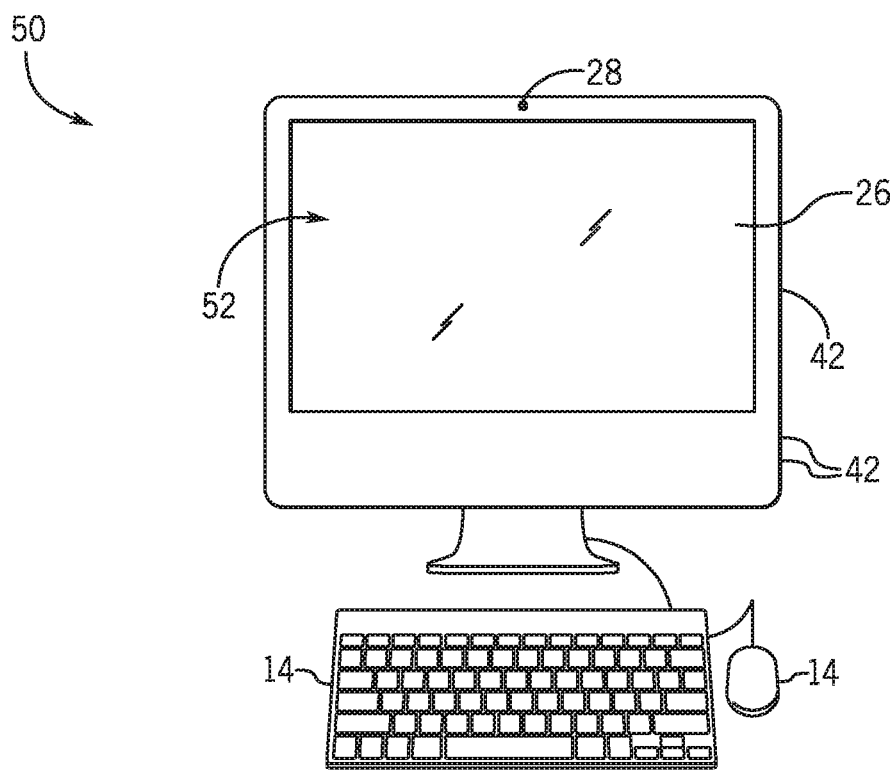
FIG. 3 is a front view of the electronic device of FIG. 1 in the form of a desktop computing device, in accordance with embodiments described herein.

FIG. 3 shows the electronic device 10 in the form of a desktop computer 50. The desktop computer 50 may include a number of features that may be generally similar to those provided by the notebook computer 40 shown in FIG. 4, but may have a generally larger overall form factor. As shown, the desktop computer 50 may be housed in an enclosure 42 that includes the display 26, as well as various other components discussed above with regard to the block diagram shown in FIG. 1. Further, the desktop computer 50 may include an external keyboard and mouse (input structures 14) that may be coupled to the computer 50 via one or more I/O ports 12 (e.g., USB) or may communicate with the computer 50 wirelessly (e.g., RF, Bluetooth, etc.). The desktop computer 50 also includes an imaging device 28, which may be an integrated or external camera, as discussed above. In certain embodiments, the depicted desktop computer 50 may be a model of an iMac®, Mac® mini, or Mac Pro®, available from Apple Inc.

Figure 4:
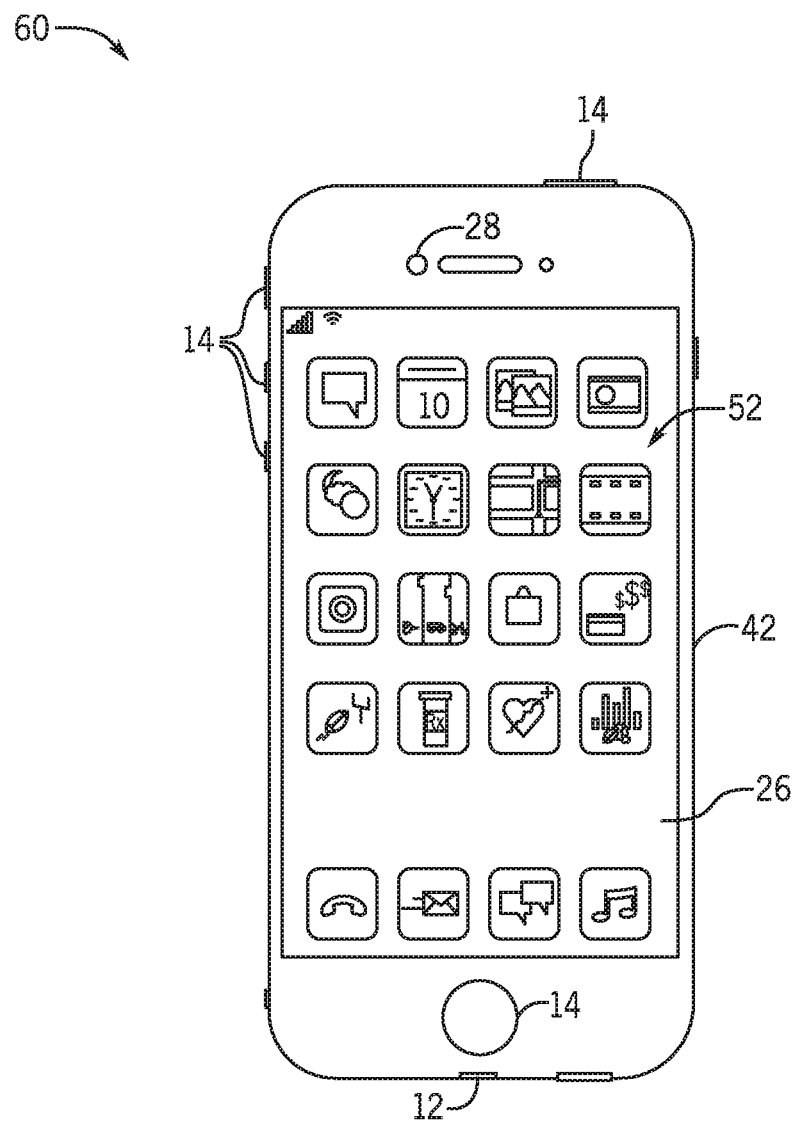
FIG. 4 is a front view of the electronic device of FIG. 1 in the form of a handheld portable electronic device, in accordance with embodiments described herein.
Figure 5:
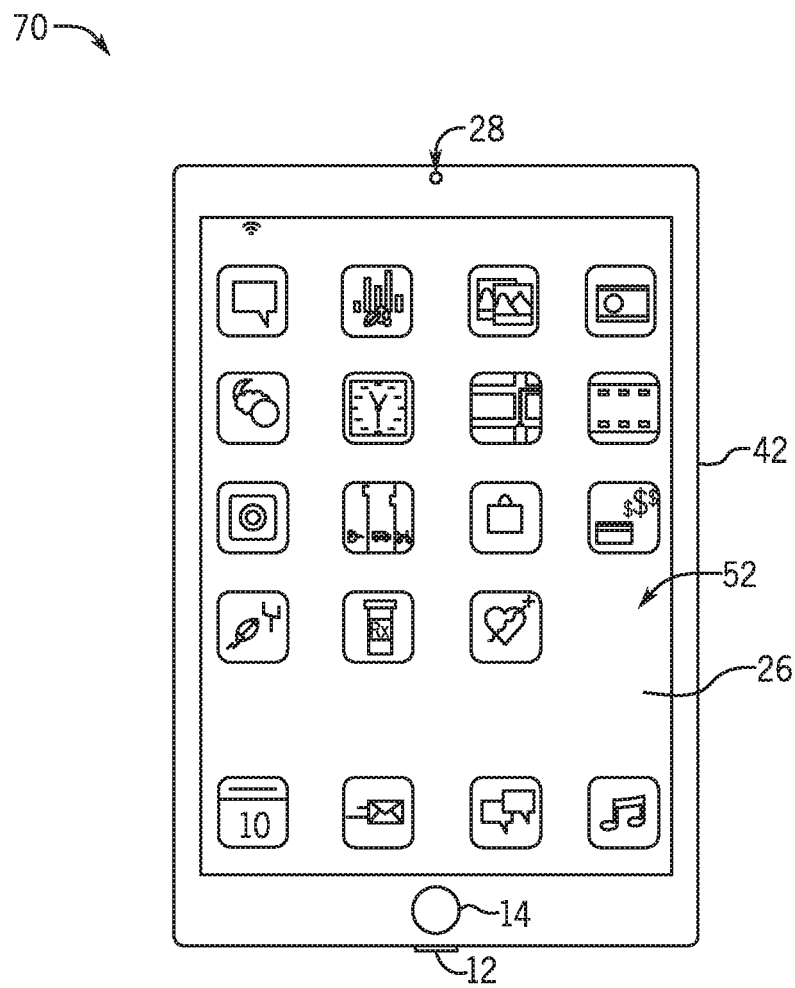
FIG. 5 is a front view of the electronic device of FIG. 1 in the form of a tablet computing device, in accordance with embodiments described herein.

The electronic device 10 may also take the form of portable handheld device 60 or 70, as shown in FIGS. 4 and 5. By way of example, the handheld device 60 or 70 may be a model of an iPod® or iPhone® available from Apple Inc. The handheld device 60 or 70 includes an enclosure 42, which may function to protect the interior components from physical damage and to shield them from electromagnetic interference. The enclosure 42 also includes various user input structures 14 through which a user may interface with the handheld device 60 or 70. Each input structure 14 may control various device functions when pressed or actuated. As shown in FIGS. 4 and 5, the handheld device 60 or 70 may also include various I/O ports 12. For instance, the depicted I/O ports 12 may include a proprietary connection port for transmitting and receiving data files or for charging a power source 24. Further, the I/O ports 12 may also be used to output voltage, current, and power to other connected devices.

The display 26 may display images generated by the handheld device 60 or 70. For example, the display 26 may display system indicators that may indicate device power status, signal strength, external device connections, and so forth. The display 26 may also display a GUI 52 that allows a user to interact with the device 60 or 70, as discussed above with reference to FIG. 3. The GUI 52 may include graphical elements, such as the icons, which may correspond to various applications that may be opened or executed upon detecting a user selection of a respective icon.

It should be noted that the embodiments presented herein should not be limited to devices depicted in FIGS. 2-5. Indeed, the devices presented above are provided as examples and the embodiments described herein may be incorporated into any suitable device. For example, the embodiments described herein may also be performed in electronic watches, electronic wearable devices, and the like.

Figure 6:
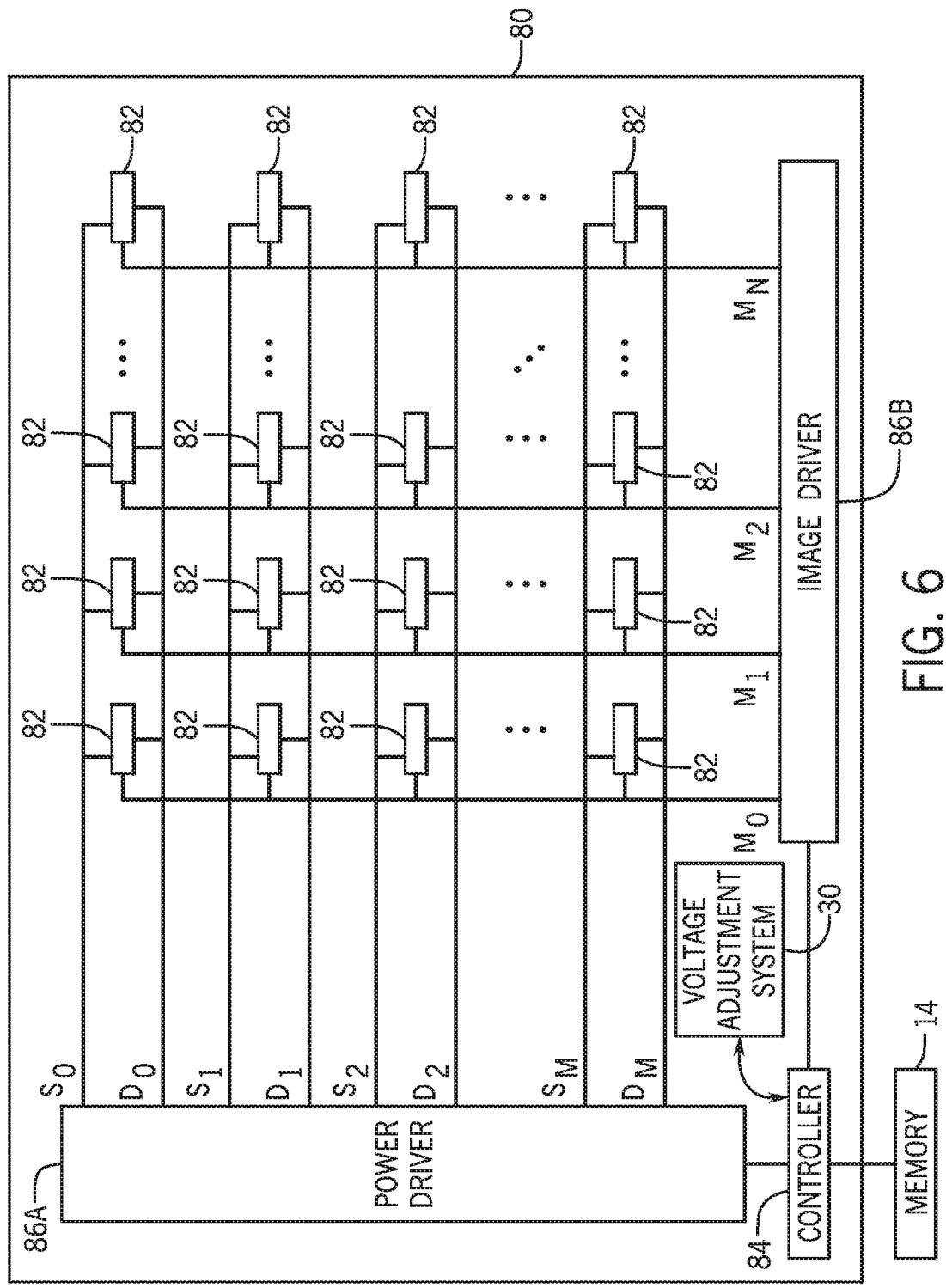
FIG. 6 is a circuit diagram of an array of self-emissive pixels of the electronic display of the electronic device of FIG. 1, in accordance with aspects of the present disclosure.

Having provided some context with regard to possible forms that the electronic device 10 may take, the present discussion will now focus on voltage adjustment system 30 of FIG. 1. Generally, the brightness depicted by each respective pixel in the display 26 is generally controlled by varying an electric field associated with each respective pixel in the display 26. Keeping this in mind, FIG. 6 illustrates one embodiment of a circuit diagram of display 26 that may generate the electrical field that energizes each respective pixel and causes each respective pixel to emit light at an intensity corresponding to an applied voltage. As shown, display 26 may include a self-emissive pixel array 80 having an array of self-emissive pixels 82.

The self-emissive pixel array 80 is shown having a controller 84, a power driver 86A, an image driver 86B, and the array of self-emissive pixels 82. The self-emissive pixels 82 are driven by the power driver 86A and image driver 86B. Each power driver 86A and image driver 86B may drive one or more self-emissive pixels 82. In some embodiments, the power driver 86A and the image driver 86B may include multiple channels for independently driving multiple self-emissive pixels 82. The self-emissive pixels may include any suitable light-emitting elements, such as organic light emitting diodes (OLEDs), micro-light-emitting-diodes (μ-LEDs), and the like.

The power driver 86A may be connected to the self-emissive pixels 82 by way of scan lines $S_0, S_1, \ldots S_{m-1}$, and $S_m$ and driving lines $D_0, D_1, \ldots D_{m-1}$, and $D_m$. The self-emissive pixels 82 receive on/off instructions through the scan lines $S_0, S_1, \ldots S_{m-1}$, and $S_m$ and generate driving currents corresponding to data voltages transmitted from the driving lines $D_0, D_1, \ldots D_{m-1}$, and $D_m$. The driving currents are applied to each self-emissive pixel 82 to emit light according to instructions from the image driver 86B through driving lines $M_0, M_1, \ldots M_{n-1}$, and $M_n$. Both the power driver 86A and the image driver 86B transmit voltage signals through respective driving lines to operate each self-emissive pixel 82 at a state determined by the controller 84 to emit light. Each driver may supply voltage signals at a duty cycle and/or amplitude sufficient to operate each self-emissive pixel 82.

The controller 84 may control the color of the self-emissive pixels 82 using image data generated by the processor(s) 16 and stored into the memory 18 or provided directly from the processor(s) 16 to the controller 84. The voltage adjustment system 30 may provide a signal to the controller 84 to adjust the data signals transmitted to the self-emissive pixels 82 such that the self-emissive pixels 82 may depict substantially uniform color and luminance provided the same current input in accordance with the techniques that will be described in detail below.

Figure 7:
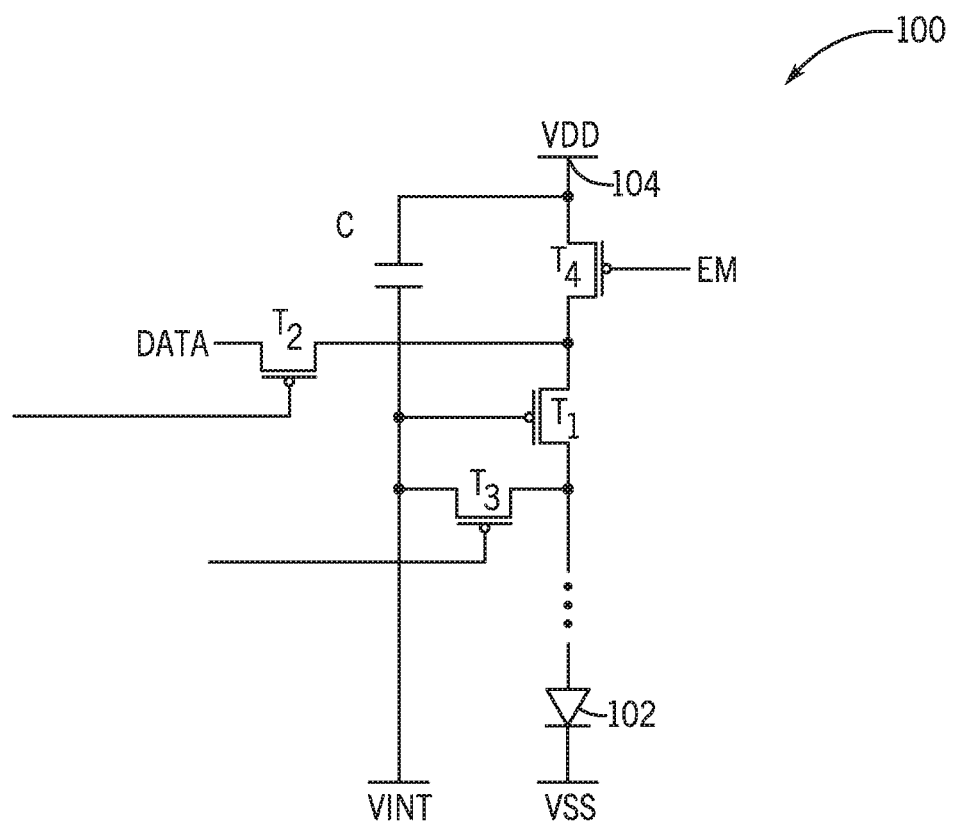
FIG. 7 is a circuit diagram of a pixel driving circuit that provides a current to a pixel in the display of the electronic device of FIG. 1, in accordance with aspects of the present disclosure.

With the foregoing in mind, FIG. 7 illustrates a pixel driving circuit 100 that may be employed to drive the self-emissive pixel 82. The pixel driving circuit 100 may include a number of semiconductor devices that may coordinate the transmission of data signals to a light-emitting diode (LED) 102 of a respective pixel 82. In one embodiment, the pixel driving circuit 100 may receive various input signals (e.g., emission signals (EM), data signals (data)), which may be coordinated in a manner to cause the pixel driving circuit 100 to illuminate the LED 102 of the respective pixel 82. Each pixel 82 of the display 26 may receive voltage from a power rail 104. As shown in FIG. 7, the power rail 104 may provide a positive voltage (VDD) to the pixel driving circuit 100.

Figure 8:
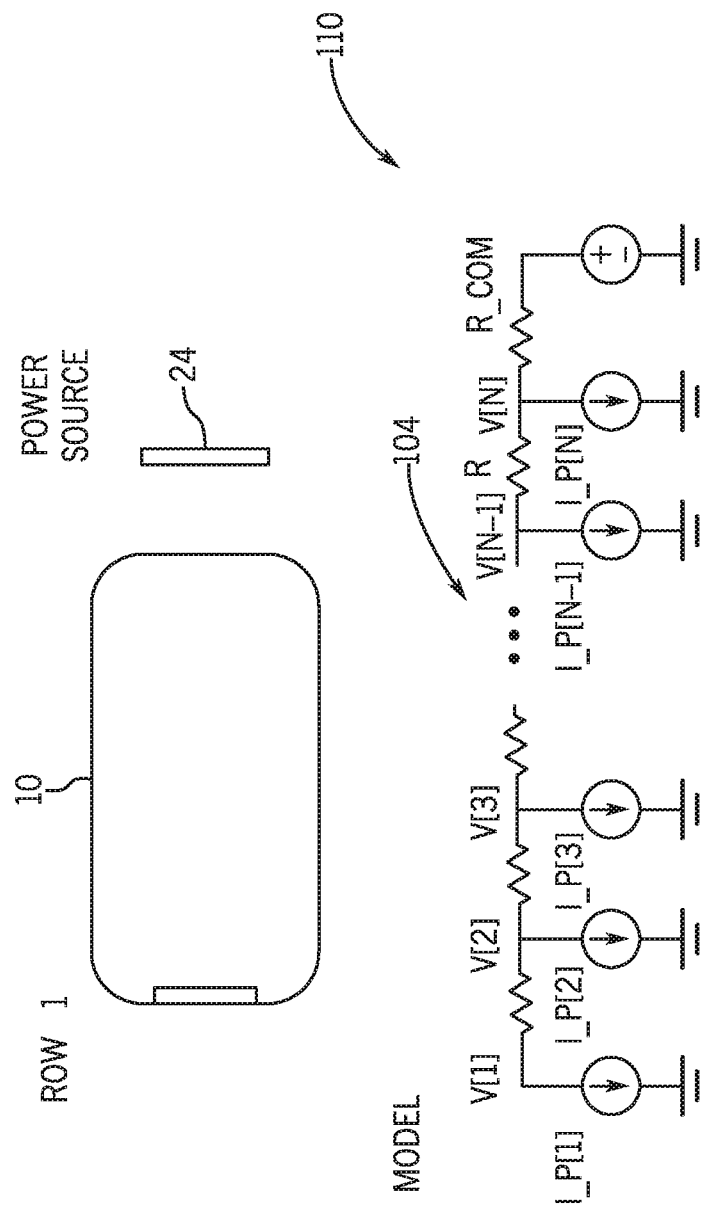
FIG. 8 is a circuit diagram that illustrates the current-resistance (IR) drop across rows of the display of the electronic device of FIG. 1, in accordance with aspects of the present disclosure.

With this in mind, FIG. 8 illustrates a circuit diagram 110 that illustrates how voltage provided via the power rail 104 may decrease across rows of the display 26. As shown in FIG. 8, the power source 24 may provide a voltage VDD to each row of the display 26. For each row of pixels 82, a common resistance ($R_{com}$) may be present along the power rail 104. In addition, a resistance (R) may also be present between each adjacent row. As such, the expected IR drop across the rows of pixels 82 in the display 26 may be represented by the following equations:

$$V[N] = R_{com} * \Sigma_{k=1}^{N} I_P[k] \quad (1)$$

$$V[N-1] = V[N] + R * \Sigma_{k=1}^{N-1} I_P[k] \quad (2)$$

$$V[N-2] = V[N-1] + R * \Sigma_{k=1}^{N-2} I_P[k] \quad (3)$$

$$V[m] = V[m+1] + R * \Sigma_{k=1}^{m} I_P[k] \quad (4)$$

where N is the total number of rows in the display 26, $I_P[k]$ is the equivalent current from the row k on the display 26, V[m] is the voltage drop on the power rail 104 at row m, $R_{com}$ is the common routing resistance for each of the rows in the display 26, and R is the unit resistance between each row of pixels 82.

Figure 9:
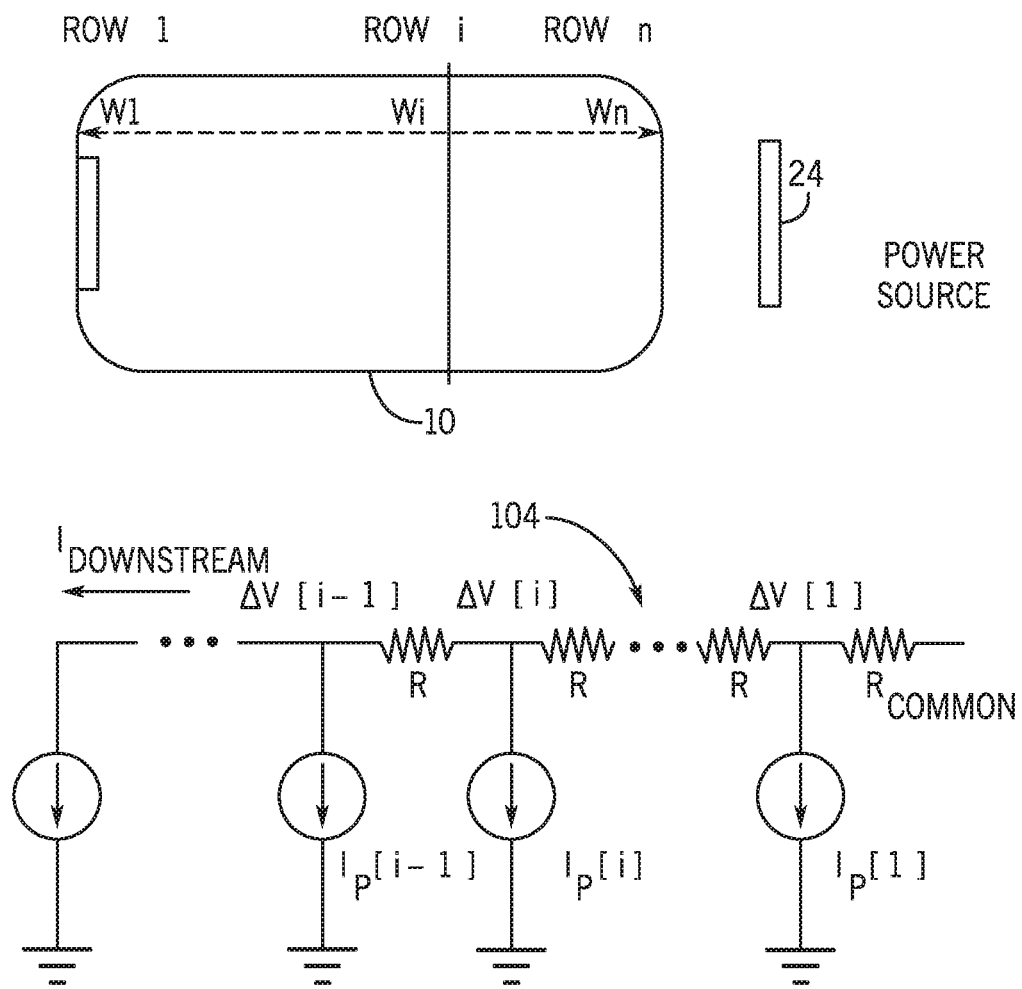
FIG. 9 is a circuit diagram that illustrates a weight value for each row of the display of the electronic device of FIG. 1, in accordance with aspects of the present disclosure.
Figure 10:
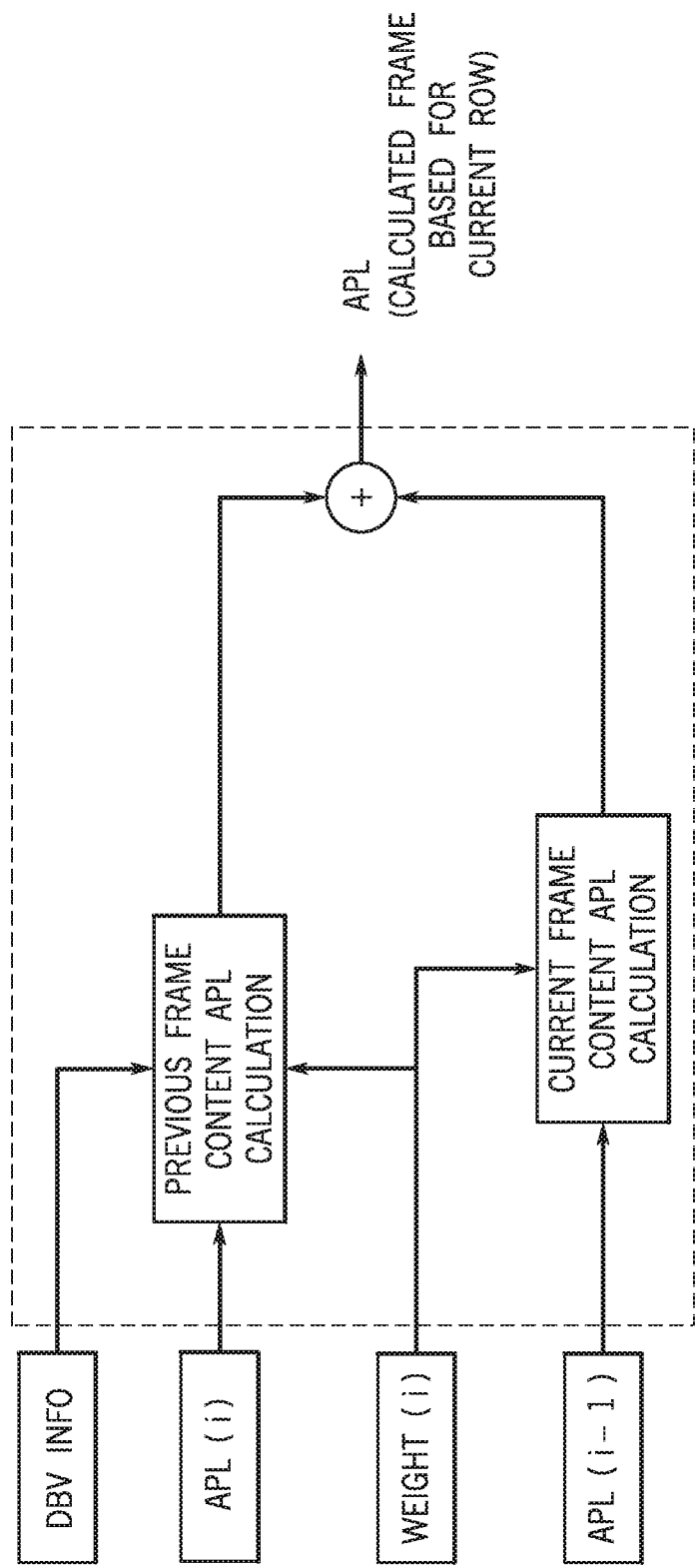
FIG. 10 illustrates a data flow diagram for determining an average picture level for a pixel in a current frame of image data for display via the electronic device of FIG. 1, in accordance with aspects of the present disclosure.

To determine a weight factor ($W_i$) to compensate for the effects of the IR drop across the display 26, the voltage adjustment system 30 may determine the expected voltage drop across the display 26 as shown in FIG. 9 and represented by the following equations.

$$\Delta V[i-1] = \Delta V[i] + R * \sum_{k=1}^{i-2} I_P[k] \quad (5)$$

$$\Delta V[i-1] = \Delta V[i+1] + R * \sum_{k=1}^{i-1} I_P[k] + R * \sum_{k=1}^{i-2} I_P[k] \quad (6)$$

$$\Delta V[i-1] = (n-i-1) * R * I_P[1] + \ldots + (n-i+1) * R * I_P[i-2] + \quad (7)$$
$$(n-i) * R * I_P[i] + (n-i-1) * R * I_P[i+1] \ldots$$

Based on the expected IR drop ($\Delta V[i]$) at a particular row i, the voltage adjustment system 30 may determine a weight factor ($W_i$) that compensates the digital pixel data value, such that the respective pixel 82 is not affected by the IR drop. That is, if the IR drop corresponds to causing the pixel 82 to render a color value that has a lower than desired gray level due to the IR drop, the voltage adjustment system 30 may determine a weight factor ($W_i$) that may be applied (e.g., multiplied) to the digital pixel data value provided to the pixel driving circuit 100, such that the gray level depicted by the pixel 82 corresponds to the desired gray level according to the provided image data. For example, the weight factor ($W_i$) or gain applied to the digital pixel data value may be greater than 1 to compensate for the reduced voltage received by the pixel driving circuit 100 via the power rail 104. In addition to applying the weight factor ($W_i$) or gain to the digital pixel value, the voltage adjustment system 30 may also adjust a gamma voltage source that provides voltages to the pixel driving circuit 100 based on the expected IR drop. Additional details regarding the adjustment to the gamma circuit will be discussed below with reference to FIG. 12.

In addition to determining the weight factor for a row within the display 26, the presently disclosed embodiments may also be employed across columns j of the display 26. That is, the equations (1)-(7) may also be applied to columns of the display 26 to determine a weight factor ($W_j$) that may compensate for the IR drop across the columns of the display 26. As such, in some embodiments, the voltage adjustment system 30 may determine a weight factor ($W_{i,j}$) for a particular pixel (i,j) according to equation (8).

$$W_{i,j} = W_{row}(i) * W_{col}(j) \quad (8)$$

It should be noted that the equivalent current $I_p[i]$ provided to any row i of pixels 82 may be proportional or directly related to the average picture level for the respective row i ($APL_{row}(i)$) or the respective column j ($APL_{col}(j)$). That is, the percentage in which the row i of pixels 82 is illuminated with respect to the row i of pixels 82 displaying a white color and the percentage in which the column j of pixels 82 is illuminated with respect to the column j of pixels 82 displaying a white color is directly proportional to the equivalent current $I_p[i]$ provided to the row i or column j. With this in mind, the voltage adjustment system 30 may, in some embodiments, adjust determine a pixel-based average picture level weight factor ($APL_{weighted\_pixel}(i,j)$) based on the average picture level ($APL_{pixel}(i, j)$) for the respective pixel 82 and the weight factor ($W_{i,j}$) for the respective pixel 82 according to the following equation.

$$APL_{weighted\_pixel}(i,j) = APL_{pixel}(i,j) * W_{i,j} \quad (9)$$

Keeping this in mind, the average picture level weight factor for the frame of image data may be determined according to equation (10) below.

$$APL_{weighted\_frame} = \Sigma_{i=1}^{m} \Sigma_{j=1}^{n} APL_{weighted\_pixel}(i,j) \quad (10)$$

In some embodiments, the voltage adjustment system 30 may use the row-based average picture level for a particular row i (e.g., $APL_{row}(i)$) and a row-based weight factor ($W_i$) for the particular row i to determine a frame-based average picture level that determines an accumulated value for the average picture level ($APL_{pixel}(i)$). The accumulated value for the average picture level ($APL_{pixel}(i)$) may account for the change in the average picture level ($APL_{pixel}(i)$) between the previous and current frame of image data. In one embodiment, the accumulated value for the average picture level ($APL_{pixel}(i)$) may be determined based on a display brightness value (DBV) for a current frame of image data and the previous frame of image data, the row-based average picture level ($APL_{row}(i)$) for the current frame of image data and the previous frame of image data, and the weight factor ($W_i$) for the current frame of image data and the previous frame of image data. By way of example, the frame-based average picture level for the particular pixel i ($APL_{pixel}(i)$) may be determined based on the data block flow diagram illustrated in FIG. 10.

In any case, in some embodiments, the frame-based average picture level for the particular pixel i ($APL_{pixel}(i)$)

may be used along with the display brightness value (DBV) for the particular pixel i, and the digital pixel data value (e.g., gray value) to generate a lookup table that provides a gain value to compensate for the IR drop at the particular pixel i. That is, the lookup table may provide a gain value that compensates for an expected IR drop at the respective pixel i. To more accurately compensate for the expected IR drop due to different loading of the display 26 (e.g., APL difference) and the different loading regions of the display 26 (e.g., location difference), a different gain value may be calculated for each pixel 82 based on the desired gray level specified in the image data, the DBV for the display 26, and the average pixel level for the particular pixel i ($APL_{pixel}(i)$). In certain embodiments, the gain values for the lookup table may be calculated based on modeling of IR drop in the display 26 and the like.

Figure 11:
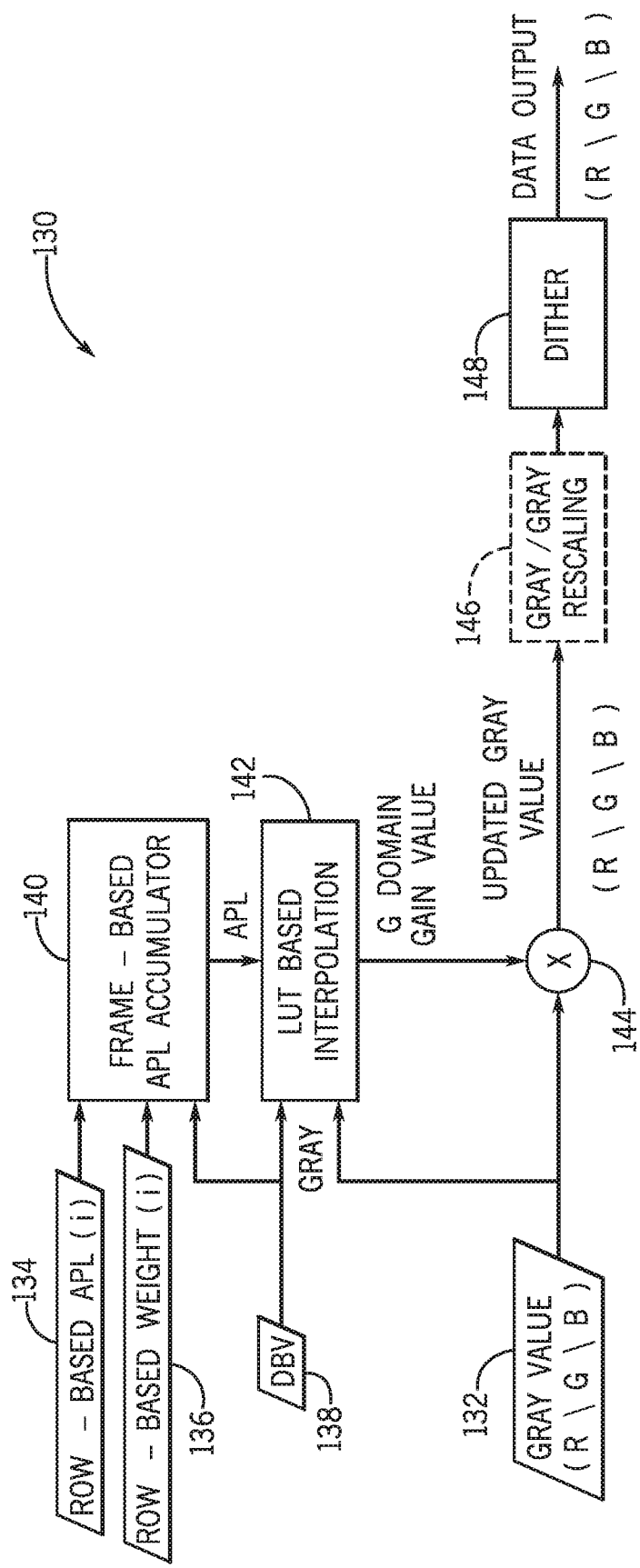
FIG. 11 illustrates a data flow diagram for compensating a gray level value provided to a pixel driving circuit of the display of the electronic device of FIG. 1, in accordance with aspects of the present disclosure.

FIG. 11 illustrates an example data flow diagram 130 that may be implemented by the voltage adjustment system 30 to adjust pixel data voltage provided to the display 26 to compensate for the expected IR drop across the display 26 in light of the display brightness value and the average picture level of the respective pixel 82. Although the description of the data flow diagram 130 is detailed as being performed by the voltage adjustment system 30, in some embodiments, the data flow diagram 130 may be performed by any suitable processing component that may be part of the electronic device 10.

Referring to FIG. 11, the voltage adjustment system 30 may receive a row-based average picture level for a row of pixels that corresponds to a respective pixel 82 of image data received by the voltage adjustment system 30. That is, the image data received by the voltage adjustment system 30 may include data related to color values for each pixel 82 to render. As such, the image data may include a gray value 132 (e.g., pixel data value) for each pixel 82 in a frame of image data.

Based on the embodiments described above and the respective pixel 82 that corresponds to a respective gray value 132 being evaluated by the voltage adjustment system 30, the voltage adjustment system 30 may determine the row-based $APL_{row}(i)$ 134 and the row-based weight factor ($W_i$) 136 for the respective pixel 82. The voltage adjustment system 30 may also receive a display brightness value (DBV) 138 for the display 26.

Based on the row-based $APL_{row}(i)$ 134, the row-based weight factor ($W_i$) 136, and the DBV 138 for the respective pixel 82 in the current frame of image data, the voltage adjustment system 30 may determine the average pixel level for the particular pixel i ($APL_{pixel}(i)$). In some embodiments, the voltage adjustment system 30 may employ a frame-based APL accumulator component 140, which may be implemented in hardware or software. The frame-based APL accumulator component 140 may determine an accumulated value for the average picture level ($APL_{pixel}(i)$) that accounts for the change in the average picture level ($APL_{pixel}(i)$) between the previous and current frame of image data, as described above with reference to FIG. 10.

After determining the average picture level ($APL_{pixel}(i)$) for the respective pixel 82, the voltage adjustment system 30 may use the average picture level ($APL_{pixel}(i)$) the DBV 138, and the respective gray value 132 as inputs to identify a gain value in a three-dimensional lookup table 142. The gain value may be applied to the respective gray value 132 to compensate for the IR drop across the display 26, as described above. In certain embodiments, the voltage adjustment system 30 may interpolate a gain value for the respective pixel 82 when a gain value is not provided in the lookup table 142. That is, the voltage adjustment system 30 may interpolate a gain value based on the gain values provided in the lookup table 142 that has an average picture level ($APL_{pixel}(i)$), a DBV 138, and a respective gray value 132 that most closely matches the input pixel 82.

After obtaining the gain value from the lookup table 142, the voltage adjustment system 30 may apply the gain value to the gray value 132 to compensate for the expected IR drop at block 144. The updated gray value may be provided to the display driver circuit 100, which may then cause the LED 102 to illuminate to the corresponding gray value. In some embodiments, the updated gray value may be provided to a gray-to-gray rescaling component 146 to correct for various brightness factors that affect certain gray values. In addition, the updated gray value may also be provided to a dither component 148, which may increase resolution for low gray values.

Figure 12:
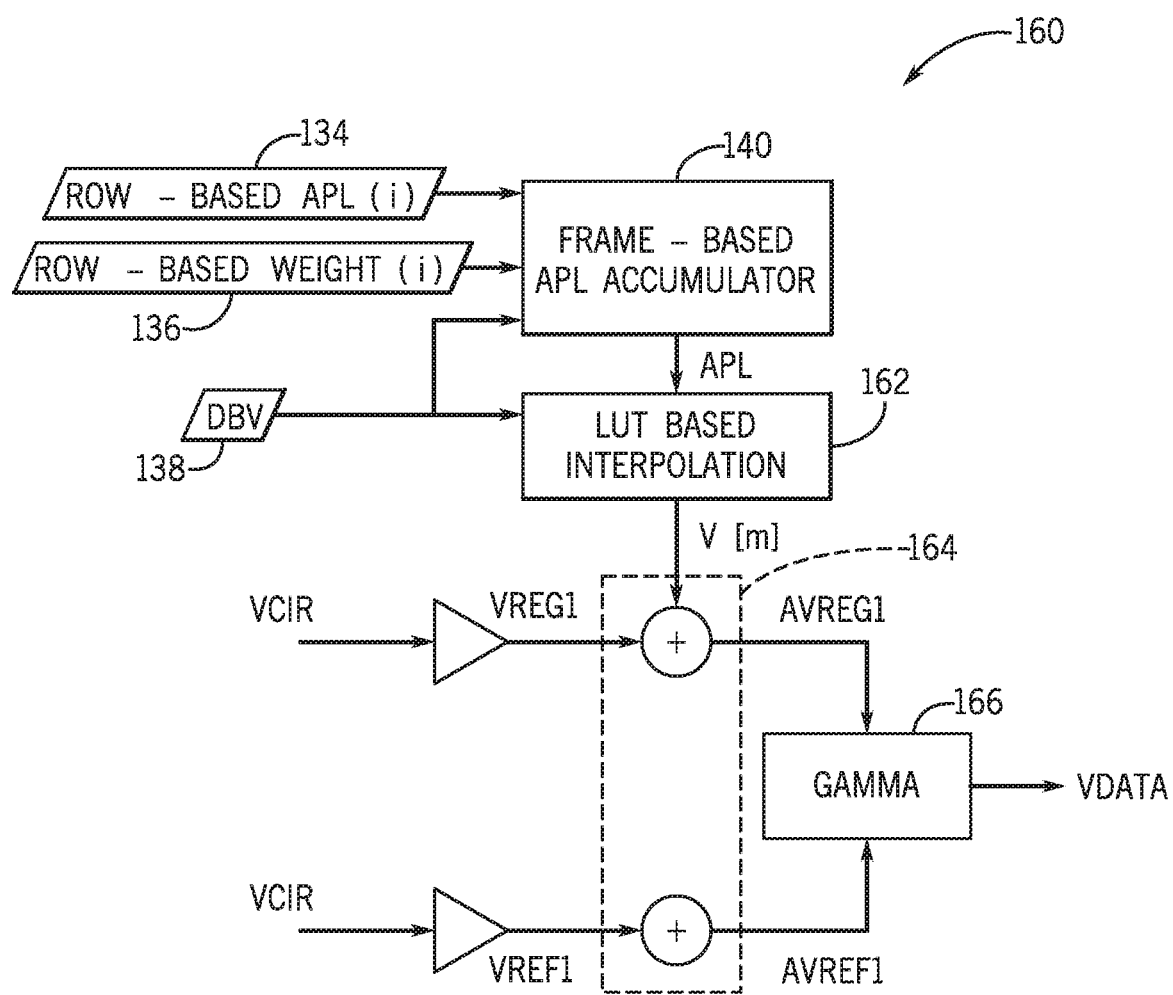
FIG. 12 illustrates a data flow diagram for compensating a gray level value provided to a pixel driving circuit of the display of the electronic device of FIG. 1, in accordance with aspects of the present disclosure.

As discussed above, the voltage adjustment system 30 may also compensate for the IR drop across the display 26 by way of an analog voltage adjustment. That is, instead of adjusting the digital pixel data value provided to the display driver circuit 100, the voltage adjustment system 30, in some embodiments, may adjust one or more voltages employed by a gamma circuit that is used by the display diver circuit 100. By way of example, FIG. 12 illustrates a data flow diagram 160 for adjusting the voltages provided to a gamma circuit employed by the display 26. Like the data flow diagram 130 of FIG. 11, the data flow diagram 160 is described below as being performed by the voltage adjustment system 30. However, it should be understood that any suitable component may perform the process described in the data flow diagram 160.

Referring now to FIG. 12, in some embodiments, the voltage adjustment system 30 may receive the row-based $APL_{row}(i)$ 134, the row-based weight factor ($W_i$) 136, and the DBV 138 for the respective pixel 82 as described above. The voltage adjustment system 30 may then use the frame-based APL accumulator component 140, which may determine an accumulated value for the average picture level ($APL_{pixel}(i)$) that accounts for the change in the average picture level ($APL_{pixel}(i)$) between the previous and current frame of image data, as described above with reference to FIG. 10. The average picture level ($APL_{pixel}(i)$) for the respective pixel 82 and the DBV 138 may be used as indexes in a two-dimensional lookup table 162. The lookup table 162 may provide a voltage value (e.g. V[m]) based on the average picture level ($APL_{pixel}(i)$) for the respective pixel 82 and the DBV 138. The voltage value may correspond to a reference voltage that may be used by a gamma circuit 166, which may provide gamma correction voltages to the display 26, thereby rendering more accurate image data. In certain embodiments, the voltage values for the lookup table may be calculated based on modeling of IR drop in the display 26 and the like.

In some embodiments, the voltage adjustment system 30 may use the voltage value (e.g. V[m]) to control the voltage outputs of a voltage adjustment circuit 164. The voltage adjustment circuit 164 may receive two reference voltages (e.g., VREG1, VREF1) and may generate a number of voltage outputs that are between the two reference voltages. For instance, the voltage adjustment circuit 164 may include a resistor ladder or some other suitable circuitry that provides a number of voltage outputs at various increments between each other. Based on the voltage value (e.g. V[m]) provided by the lookup table 162, the voltage adjustment system 30 may select different voltage tabs (e.g., voltage outputs) or adjust circuitry (e.g. switches, multiplexer)

within the voltage adjustment circuit 164 to provide adjusted reference voltages (e.g., AVREG1, AFVREF1) to the gamma circuit 166. The desired voltage level that corresponds to the gray value for the respective pixel 82, as provided in the corresponding frame of image data, may then be provided to the display driver circuit 100 or another suitable circuit to cause the LED 102 to illuminate accordingly.

It should be noted that the voltage adjustment system 30 may also interpolate a voltage value (e.g. V[m]) using the lookup table 162. That is, the voltage adjustment system 30 may determine a voltage value (e.g. V[m]) for the received average picture level ($APL_{pixel}(i)$) for the respective pixel 82 and the received DBV 138 by interpolating the voltage value (e.g. V[m]) based on the voltage values of the lookup table 162 that are closest to the received average picture level ($APL_{pixel}(i)$) for the respective pixel 82 and the received DBV 138.

By adjusting the voltage outputs provided to the gamma circuit 166, the voltage adjustment system 30 may adjust the voltage provided to the display driver circuit 100 without adjusting the pixel data value for each pixel 82 of the display 26. With this in mind, the analog voltage adjustment technique described in FIG. 12 may be less complex to implement, as compared to the pixel data voltage adjustment technique described in FIG. 11. Nevertheless, in either case, the voltage adjustment system 30 may assist the display 26 to depict color values more uniformly, while accounting for the IR drop across the display 26, the various frame loading conditions of the display 26, the various loading regions of the display 26, and the like.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

What is claimed is:

1. A display device, comprising:
    a plurality of rows of pixels configured to display image data on a display; and
    a circuit configured to:
        receive a pixel data value of image data for a pixel in a first row of the plurality of rows of pixels;
        determine a first weight factor to apply to the pixel data value based on a position of the first row with respect to the plurality of rows, wherein each row of the plurality of rows is associated with a current-resistance (IR) drop across the display, and wherein the first weight factor is determined based on a respective IR drop associated with the first row;
        determine a second weight factor to apply to the pixel data value based on a second position of a first column in which the pixel resides with respect to a plurality of columns in the display, wherein each column of the plurality of columns is associated with a current-resistance (IR) drop across the display, and wherein the second weight factor is determined based on an additional respective IR drop associated with the first column;
        generate a weighted pixel data value based on the first weight factor, the second weight factor, and the pixel data value; and
        send the weighted pixel data value to a display driver circuit configured to render the image data via the display.

2. The display device of claim 1, wherein the respective IR drop associated with the first row is determined based on a common resistance associated with the plurality of rows and one or more resistances associated with one or more rows of the plurality of rows between a voltage source and the first row.

3. The display device of claim 1, wherein the first weight factor is configured to compensate the pixel data value for one or more effects due to the respective IR drop associated with the first row.

4. The display device of claim 1, comprising a power rail configured to provide a voltage to the display driver circuit.

5. A method, comprising:
    determining, via a processor, an average picture level for a pixel in a row of pixels of a plurality of rows of pixels in a display;
    determining, via the processor, a gain value for a pixel data value that corresponds to the pixel based on a brightness level associated with the display and the average picture level, wherein the gain value is configured to compensate the pixel data value for a current-resistance (IR) drop associated with the row of pixels;
    applying, via the processor, the gain value to the pixel data value to generate an updated pixel data value; and
    sending, via the processor, the updated pixel data value to a display driver circuit associated with the pixel, wherein the display driver circuit is configured to render the updated pixel data value via the display.

6. The method of claim 5, comprising:
    determining, via the processor, a weight factor for the pixel based on a position of the pixel in the row of pixels, wherein each row of the plurality of rows is associated with a respective current-resistance (IR) drop;
    determining, via the processor, a frame-based average picture level for the pixel based on the average picture level for the pixel associated with a current frame of image data and an additional average picture level for the pixel associated with a previous frame of the image data; and
    determining, via the processor, the gain value based on the brightness level, the frame-based average picture level, and the pixel data value.

7. The method of claim 6, wherein the weight factor is determined based on the respective IR drop associated with the row of pixels.

8. The method of claim 6, wherein the determining the gain value comprises extracting the gain value from a lookup table organized with respect to a plurality of brightness levels, a plurality of average picture levels, and a plurality of pixel data values.

9. The method of claim 6, wherein the determining the gain value comprises:
    extracting at least two gain values from a lookup table organized with respect to a plurality of brightness levels, a plurality of average picture levels, and a plurality of pixel data values; and
    interpolating the gain value based on the at least two gain values.

10. The method of claim 6, comprising applying a gray-to-gray rescaling operation to the updated pixel data value before sending the updated pixel data value to the display driver circuit.

11. The method of claim 10, comprising applying a dithering operation to the updated pixel data value before sending the updated pixel data value to the display driver circuit.

12. The method of claim 6, wherein the pixel data value corresponds to a digital gray value.

13. A method, comprising:
receiving, via a processor, a gray value for a pixel in a row of pixels of a plurality of rows of pixels in a display during a frame of image data;
determining, via the processor, an average picture level for the pixel in the row of pixels of the plurality of rows of pixels in the display during the frame of image data;
determining, via the processor, a gain value for a pixel data value that corresponds to the pixel based on a brightness level associated with the display and the average picture level, wherein the gain value is configured to compensate the pixel data value for a current-resistance (IR) drop associated with the row of pixels;
determining, via the processor, a voltage value for the pixel based on the brightness level, average picture level, and the gain value, wherein the gain value is applied to the gray value to determine the voltage value, and wherein the voltage value is configured to compensate for one or more effects on the display due to the current-resistance (IR) drop associated with the row of pixels; and
adjusting, via the processor, a voltage adjustment circuit based on the voltage value, wherein the adjusted voltage adjustment circuit is configured to output a plurality of voltages to a gamma circuit coupled to a display driver circuit, and wherein the display driver circuit is configured to render the frame of the image data corresponding to the plurality of voltages via the display.

14. The method of claim 13, comprising:
determining, via the processor, a weight factor for the pixel based on a position of the pixel in the row of pixels, wherein each row of the plurality of rows is associated with a respective current-resistance (IR) drop;
determining, via the processor, a frame-based average picture level for the pixel based on the average picture level for the pixel associated with the frame of the image data and an additional average picture level for the pixel associated with a previous frame of the image data; and
determining, via the processor, the voltage value based on the brightness level and the frame-based average picture level.

15. The method of claim 13, wherein the determining the voltage value comprises extracting the voltage value from a lookup table organized with respect to a plurality of brightness levels and a plurality of average picture levels.

16. The method of claim 13, wherein the determining the voltage value comprises:
extracting at least two voltage values from a lookup table organized with respect to a plurality of brightness levels and a plurality of average picture levels; and
interpolating the voltage value based on the at least two voltage values.

17. The method of claim 13, wherein the voltage adjustment circuit comprises a resistor ladder.

18. The method of claim 13, wherein the voltage adjustment circuit comprises a multiplexer.

* * * * *

UNITED STATES PATENT AND TRADEMARK OFFICE
CERTIFICATE OF CORRECTION

PATENT NO. : 11,302,264 B2
APPLICATION NO. : 16/510755
DATED : April 12, 2022
INVENTOR(S) : Shengkui Gao et al.

It is certified that error appears in the above-identified patent and that said Letters Patent is hereby corrected as shown below:

In the Claims

Column 15, Line 22, insert --the-- between "level," and "average".

Signed and Sealed this
Twenty-first Day of February, 2023

Katherine Kelly Vidal
Director of the United States Patent and Trademark Office